(12) United States Patent  (10) Patent No.: US 8,704,304 B1
Yu  (45) Date of Patent: Apr. 22, 2014

(54) SEMICONDUCTOR STRUCTURE

(71) Applicant: Kun-Huang Yu, New Taipei (TW)

(72) Inventor: Kun-Huang Yu, New Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/645,668

(22) Filed: Oct. 5, 2012

(51) Int. Cl.
  *H01L 29/66* (2006.01)
(52) U.S. Cl.
  USPC ............................................. 257/343
(58) Field of Classification Search
  USPC .............................................. 257/408, 492
  See application file for complete search history.

(56) References Cited

U.S. PATENT DOCUMENTS

| | | |
|---|---|---|
| 4,344,081 A | 8/1982 | Pao |
| 4,396,999 A | 8/1983 | Malaviya |
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,268,589 A | 12/1993 | Dathe |
| 5,296,393 A | 3/1994 | Smayling |
| 5,326,711 A | 7/1994 | Malhi |
| 5,346,835 A | 9/1994 | Malhi |
| 5,430,316 A | 7/1995 | Contiero |
| 5,436,486 A | 7/1995 | Fujishima |
| 5,534,721 A | 7/1996 | Shibib |
| 5,804,863 A | 9/1998 | Rhee |
| 5,811,850 A | 9/1998 | Smayling |
| 5,950,090 A | 9/1999 | Chen |
| 5,998,301 A | 12/1999 | Pham |
| 6,066,884 A | 5/2000 | Krutsick |
| 6,144,538 A | 11/2000 | Chao |
| 6,165,846 A | 12/2000 | Carns |
| 6,245,689 B1 | 6/2001 | Hao |
| 6,277,675 B1 | 8/2001 | Tung |
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |

(Continued)

*Primary Examiner* — Matthew W Such
*Assistant Examiner* — Warren H Kilpatrick
(74) *Attorney, Agent, or Firm* — WPAT, PC; Justin King

(57) ABSTRACT

A semiconductor structure is provided. The semiconductor structure includes a semiconductor substrate, a dielectric layer, a dielectric structure and an electrode structure. The dielectric layer is on an upper substrate surface of the semiconductor substrate. The dielectric structure and the semiconductor substrate have opposing first and second interfaces therebetween. The electrode structure comprises an electrode truck portion and at least one electrode branch portion. The at least one electrode branch portion is extended from the electrode truck portion down into the dielectric structure. The at least one electrode branch portion and the first interface have the smallest gap distance substantially bigger than 300 Å therebetween.

5 Claims, 3 Drawing Sheets

(56) References Cited

U.S. PATENT DOCUMENTS

| | | |
|---|---|---|
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 8,076,749 B2 | 12/2011 | Kitagawa |
| 8,115,253 B2 | 2/2012 | Tang |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0261407 A1 | 11/2006 | Blanchard |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0132033 A1 | 6/2007 | Wu |
| 2007/0170539 A1 | 7/2007 | Kao |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0108348 A1 | 4/2009 | Yang |
| 2009/0111252 A1 | 4/2009 | Huang |
| 2009/0159966 A1 | 6/2009 | Huang |
| 2009/0256212 A1* | 10/2009 | Denison et al. ............... 257/408 |
| 2009/0278208 A1 | 11/2009 | Chang |
| 2009/0283825 A1 | 11/2009 | Wang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0148250 A1 | 6/2010 | Lin |
| 2010/0213517 A1 | 8/2010 | Sonsky |
| 2011/0057263 A1 | 3/2011 | Tang |

* cited by examiner

SEMICONDUCTOR STRUCTURE

BACKGROUND

1. Technical Field

The disclosure relates in general to a semiconductor structure and more particularly to a semiconductor device of LDMOS, EDMOS, or FDMOS, etc.

2. Description of the Related Art

In the semiconductor technology, the feature size of the semiconductor structure has been reduced. In the meantime, the rate, the efficiency, the density and the cost per integrated circuit unit have been improved.

For example, many methods have been proposed for increasing a breakdown voltage (BVD) of a semiconductor structure such as a lateral double diffused metal-oxide-semiconductor field-effect transistor (LDMOS), an extended drain metal-oxide-semiconductor field-effect transistor (EDMOS) or a field drift metal-oxide-semiconductor field-effect transistor (FDMOS) and so on. However, an on-state resistance (Ron) of the semiconductor structure would be increased due to the conventional methods. Therefore, the semiconductor structure could not obtain a trade off between the BVD and the Ron for obtaining a desired small figure of merit (FOM=Ron/BVD).

SUMMARY

A semiconductor structure is provided. The semiconductor structure comprises a semiconductor substrate, a dielectric layer, a dielectric structure and an electrode structure. The semiconductor substrate has an upper substrate surface. The dielectric layer is on the upper substrate surface. The dielectric structure is in the semiconductor substrate. The dielectric structure and the semiconductor substrate have opposing first and second interfaces. The first interface is more adjacent to the dielectric layer than the second interface. The electrode structure comprises an electrode truck portion and at least one electrode branch portion. The at least one electrode branch portion is extended from the electrode truck portion down into the dielectric structure. The electrode truck portion is on the dielectric structure and the dielectric layer on opposing sides of the at least one electrode branch portion. The at least one electrode branch portion and the first interface have the smallest gap distance substantially bigger than 300 Å therebetween.

A semiconductor structure is provided. The semiconductor structure comprises a semiconductor substrate, a first source/drain, a second source/drain, a dielectric structure, a dielectric layer and an electrode structure. The semiconductor substrate has an upper substrate surface. The first source/drain is formed in the semiconductor substrate. The second source/drain is formed in the semiconductor substrate. The dielectric structure is in the semiconductor substrate between the first source/drain and the second source/drain. The dielectric layer is on the upper substrate surface between the first source/drain and the second source/drain. The electrode structure comprises an electrode truck portion and at least two electrode branch portions. The electrode truck portion is on the dielectric structure and the dielectric layer. The electrode branch portions are extended from the electrode truck portion down into the dielectric structure and separated from each other by the dielectric structure.

The above and other aspects of the disclosure will become better understood with regard to the following detailed description of the non-limiting embodiment(s). The following description is made with reference to the accompanying drawings.

DETAILED DESCRIPTION

Figure 1:
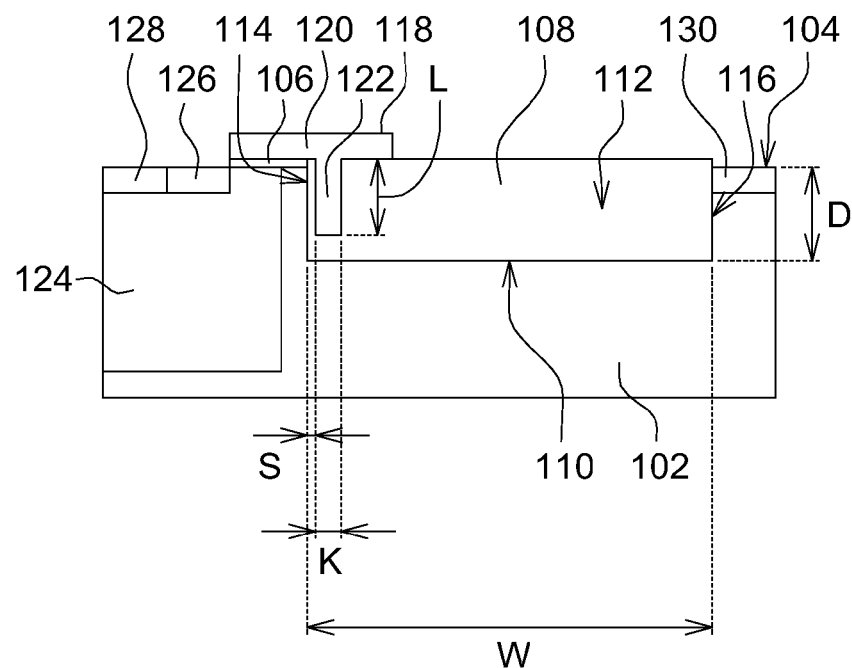
FIG. 1 illustrates a cross-section view of a semiconductor structure according to one embodiment.

FIG. 1 illustrates a cross-section view of a semiconductor structure according to one embodiment. A semiconductor substrate 102 has an upper substrate surface 104. A dielectric layer 106 may be formed on the upper substrate surface 104. For example, the semiconductor substrate 102 may comprise a doped region formed by doping a silicon material substrate, an active region defined by an isolation element not shown, an epitaxial, or other suitable materials. The dielectric layer 106 may comprise an oxide or a nitride, such as silicon oxide or silicon nitride, or other suitable materials. The dielectric layer 106 may be formed by a method comprising a thermal growth method, a deposition method such as CVD, PVD, etc.

Referring to FIG. 1, a dielectric structure 108 is formed on the semiconductor substrate 102. The dielectric structure 108 has a lower dielectric surface 110 below the upper substrate surface 104. For example, the semiconductor substrate 102 may have a trench 112 etched from the upper substrate surface 104 down into the semiconductor substrate 102, and the trench 112 is filled with the dielectric structure 108. In some embodiments, the trench 112 may have a depth D, which may be defined as a distance between the upper substrate surface 104 and the lower dielectric surface 110. The depth D may be varied according to process generation. In some embodiments, the depth D of the trench 112 is about 0.4 µm. However, in the present disclosure, the dielectric structure 108 is not limited to STI as shown in FIG. 1. In some embodiments, the dielectric structure 108 comprises LOCOS or other suitable structures (not shown). The dielectric structure 108 may comprise an oxide or a nitride, such as silicon oxide or silicon nitride, or other suitable materials. The dielectric structure 108 may be formed by a method comprising a thermal growth method, a deposition method such as CVD, PVD, etc Referring to FIG. 1, the dielectric structure 108 and the semiconductor substrate 102 have a first interface 114 and a second interface 116. The first interface 114 is opposite to the second interface 116. The first interface 114 is more adjacent to the dielectric layer 106 than the second interface 116. The first interface 114 and the second interface 116 have a gap distance W therebetween. The gap distance W may be adjusted according to operation voltage of the device. For example, the gap distance W is about 4 µm.

Referring to FIG. 1, in this embodiment, an electrode structure 118 comprises an electrode truck portion 120 and a single electrode branch portion 122. The electrode branch portion 122 is extended from the electrode truck portion 120 down into the dielectric structure 108. In addition, the electrode truck portion 120 is extended on the dielectric structure 108 and the dielectric layer 106 on opposing sidewalls of the electrode branch portion 122. In the arrangement design, the most right sidewall of the electrode structure 118, i.e. the most right sidewall of the electrode truck portion 120 in this embodiment, is not extended beyond the second interface 116. Moreover, a lower surface of the electrode branch portion 122 is not extended beyond the lower dielectric surface 110 of the dielectric structure 108. The electrode branch portion 122 has a length L which may be defined as a distance between a lower surface of the electrode truck portion 120 and the lower surface of the electrode branch portion 122. For example, the length L is about 0.3 μm. The electrode branch portion 122 has a width K. The width K may be adjusted properly according to actual demands. For example, the minimum of the width K may be the critical feature according to manufacturing processes. In one embodiment, the width K is about 0.1 μm. In embodiments, the electrode branch portion 122 and the first interface 114 have the smallest gap distance S therebetween. The smallest gap distance S is bigger than 300 Å substantially. For example, the smallest gap distance S is about 350 Å. The electrode structure 118 comprising the electrode truck portion 120 and the electrode branch portion 122 may comprise suitable conductive materials such as a polysilicon, a metal, a metal silicide, etc. The concept of the electrode structure 118 can improve a device to have higher efficiency such as higher BVD or lower Ron.

Referring to FIG. 1, in embodiments, the semiconductor structure is a MOS device. For example, a doped well 124 may be formed in the semiconductor substrate 102 adjacent to the first interface 114 by a doping step. A first source/drain 126 and a heavily doped region 128 may be formed in the doped well 124 by a doping step. A second source/drain 130 may be formed in the semiconductor substrate 102 adjacent to the second interface 116 by a doping step. The dielectric layer 106 on the upper substrate surface 104 between the first source/drain 126 and the first interface 114 is used as a gate insulating layer. The electrode structure 118 comprising the electrode branch portion 122 and the electrode truck portion 120 is used as a gate electrode. In some embodiments, the semiconductor structure as shown in FIG. 1 is a lateral double diffused metal-oxide-semiconductor field-effect transistor (LDMOS). In this case, the semiconductor substrate 102, the first source/drain 126 and the second source/drain 130 have a first type conductivity. The doped well 124 and the heavily doped region 128 have a second type conductivity opposite to the first type conductivity. In a case of the semiconductor structure being an NMOS, the first type conductivity is N-type conductivity, and the second type conductivity is P-type conductivity. In embodiments, the semiconductor structure can have an increased BVD and a decreased Ron at the same time. In embodiments, the concept of the electrode structure 118 is not limited to applying for the LDMOS. It can be applied for other kinds of semiconductor devices.

Figure 2:
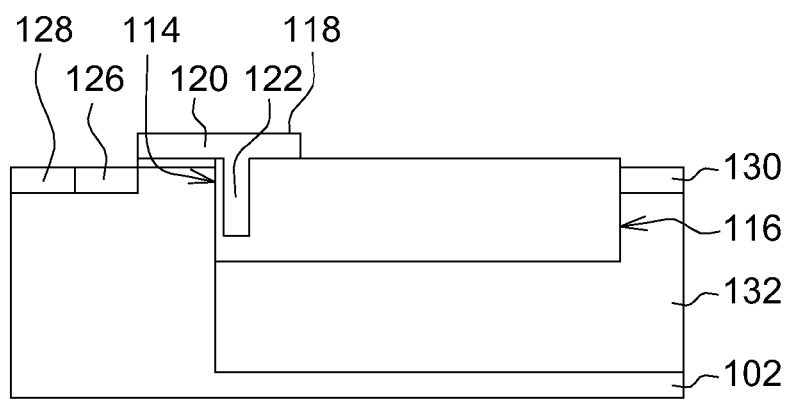
FIG. 2 illustrates a cross-section view of a semiconductor structure according to one embodiment.

The semiconductor structure in FIG. 2 is different from the semiconductor structure in FIG. 1 in that a doped well 132 may be formed in the semiconductor substrate 102 by a doping step. The first source/drain 126 and the heavily doped region 128 may be formed in the semiconductor substrate 102 adjacent to the first interface 114. The second source/drain 130 may be formed in the doped well 132 adjacent to the second interface 116 by a doping step. In one embodiment, the semiconductor structure in FIG. 2 is an extended drain metal-oxide-semiconductor field-effect transistor (EDMOS). In this case, the first source/drain 126, the second source/drain 130 and the doped well 132 have the first type conductivity, and the heavily doped region 128 and the semiconductor substrate 102 have the second type conductivity. In a case of the semiconductor structure being a NMOS, the first type conductivity is N-type conductivity, and the second type conductivity is P-type conductivity.

The semiconductor structure is not limited to the electrode structure 118 having the single electrode branch portion 122 as shown in FIG. 1 and FIG. 2. In other embodiments, the electrode structure of the semiconductor structure may comprise at least two the electrode branch portions.

Figure 3:
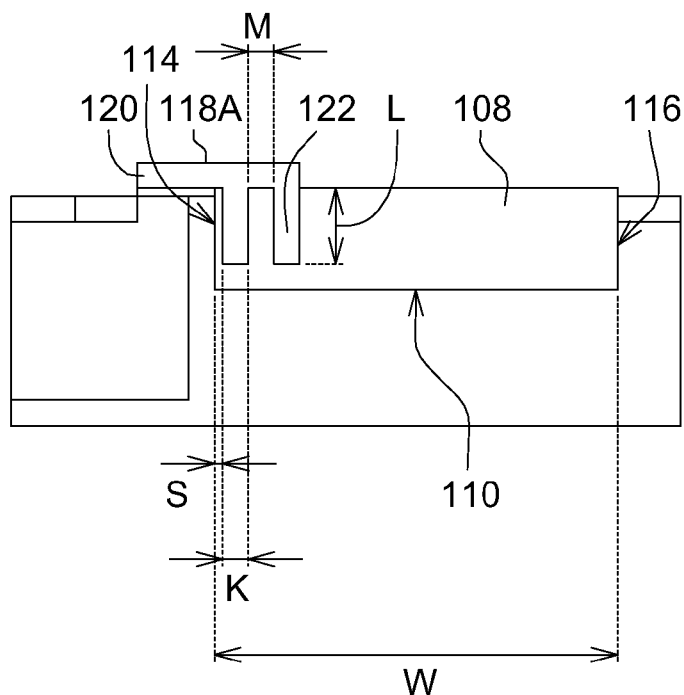
FIG. 3 illustrates a cross-section view of a semiconductor structure according to one embodiment.
Figure 4:
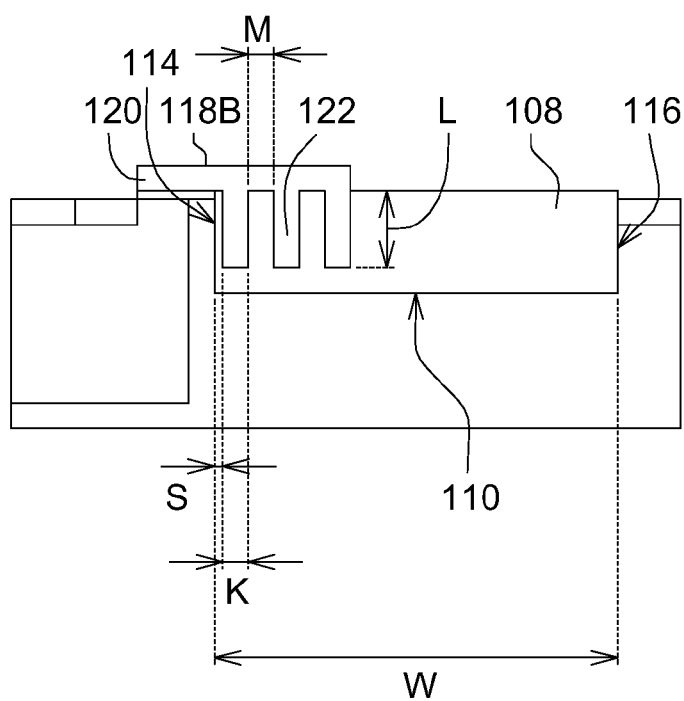
FIG. 4 illustrates a cross-section view of a semiconductor structure according to one embodiment.

For example, the semiconductor structures in FIG. 3 and FIG. 4 are different from the semiconductor structure in FIG. 1 in that the electrode structure 118A (FIG. 3) comprises the two electrode branch portions 122, and the electrode structure 118B (FIG. 4) comprises the three electrode branch portions 122. In other embodiments, the electrode structure having any other numbers of the electrode branch portion 122 (not shown) may be used.

Referring to FIG. 3 and FIG. 4, the electrode branch portions 122 are extended from the electrode truck portion 120 down into the dielectric structure 108 and are separated from each other by the dielectric structure 108. For example, the electrode branch portions 122 have a gap distance M therebetween. For example, the minimum of the gap distance M may be the critical feature according to manufacturing processes. The maximum of the gap distance M would not be greater than one third of a width of the dielectric structure 108 that may be regarded as the gap distance W between the first interface 114 and the second interface 116. In one embodiment, the gap distance M is about 0.1 μm. The electrode branch portions 122 have the width K respectively. The minimum of the width K may be the critical feature according to manufacturing processes. The maximum of the width K would not be greater than one third of the width of the dielectric structure 108 that may be regarded as the gap distance W between the first interface 114 and the second interface 116. For example, the width K is about 0.1 μm. In the arrangement design, the most right sidewall of the electrode structures 118A, 118B, i.e. the most right sidewall of the electrode branch portion 122 in this embodiment, is not extended beyond the second interface 116. Moreover, the lower surface of the electrode branch portion 122 is not extended beyond the lower dielectric surface 110 of the dielectric structure 108. The electrode branch portions 122 have the length L respectively. In one embodiment, the length L is about 0.3 μm. In embodiments, the electrode branch portion 122 and the first interface 114 close to a channel region has the smallest gap distance S substantially bigger than 300 Å, such as about 350 Å.

In other embodiments (not shown), for the electrode structure comprising the plurality of the electrode branch portions, the electrode truck portion may be extended laterally beyond the most right electrode branch portion according to concepts similar with that for the semiconductor structures as shown in FIG. 1, FIG. 2.

The concept of the electrode structure comprising the plurality of the electrode branch portions can be applied to the semiconductor structure as shown in FIG. 2. The concept of the electrode structure according to embodiments can improve a device to have higher efficiency such as higher BVD or lower Ron.

Figure 5:
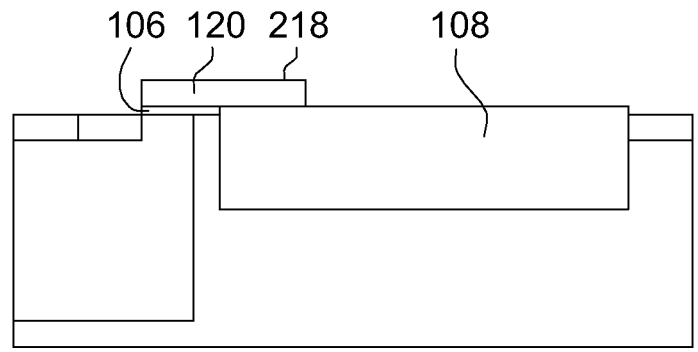
FIG. 5 illustrates a cross-section view of a semiconductor structure according to one embodiment.
Figure 6:
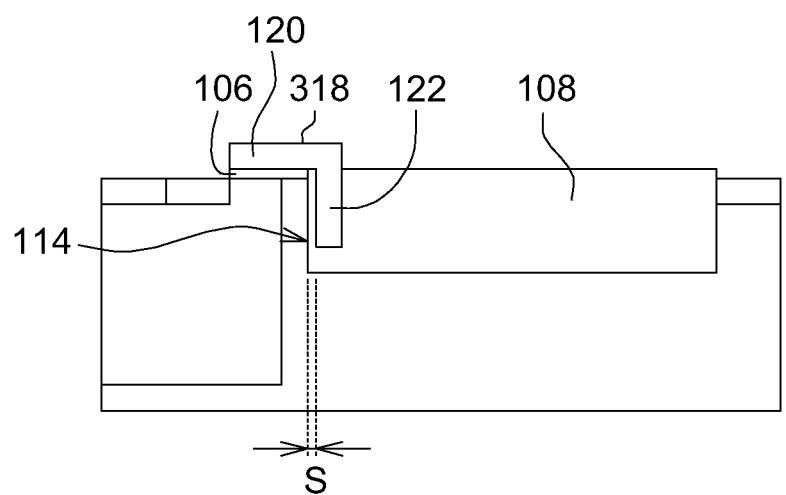
FIG. 6 illustrates a cross-section view of a semiconductor structure according to one embodiment.

Table 1 shows characteristics of the semiconductor structure in embodiments 1~4 and comparative examples 5~7. The semiconductor structures in embodiment 1, embodiment 2, embodiment 3 and embodiment 4 comprise one electrode branch portion 122 (FIG. 1), three electrode branch portions 122 (FIG. 4), five electrode branch portions 122, and seven electrode branch portions 122. The electrode branch portion(s) 122 and the first interface 114 have the smallest gap distance S about 350 Å therebetween. In comparative example 5, the electrode structure 218 comprises only the electrode truck portion 120 extended on the dielectric layer 106 and the dielectric structure 108 as shown in FIG. 5. In comparative examples 6~7, the electrode truck portion 120 of the electrode structure 318 is extended on the dielectric structure 108 and the dielectric layer 106 only on the single sidewall of the electrode branch portion 122 as shown in FIG. 6. In addition, the difference between comparative example 6 and comparative example 7 is that the smallest gap distance S between the electrode branch portions 122 and the first interface 114 are about 350 Å and 125 Å respectively. Table 1 also shows that as compared to comparative examples 5~7, embodiments 1~4 can have higher BVD and lower Ron at the same time, which can be indicated by a smaller figure of merit (Ron/BVD). Therefore, the semiconductor structures in embodiments 1~4 have higher efficiency. The results in embodiments 1~4 also show that the figure of merit (Ron/BVD) is decreased as the number of the electrode branch portions 122 is increased.

| | amount of electrode branch portion | smallest gap distance S (Å) | BVD (V) | Ron (mohm * mm2) | Ron/BVD |
|---|---|---|---|---|---|
| Embodiment 1 | 1 | 350 | 46 | 52.00 | 1.13 |
| Embodiment 2 | 3 | 350 | 50 | 50.91 | 1.02 |
| Embodiment 3 | 5 | 350 | 51 | 49.56 | 0.97 |
| Embodiment 4 | 7 | 350 | 52 | 48.66 | 0.94 |
| Comparative example 5 | 0 | NA | 46 | 56.84 | 1.24 |
| Comparative example 6 | 1 | 350 | 36 | 53.08 | 1.47 |
| Comparative example 7 | 1 | 125 | 32 | 52.60 | 1.64 |

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    a semiconductor substrate having an upper substrate surface;
    a first source/drain formed in the semiconductor substrate;
    a second source/drain formed in the semiconductor substrate;
    a dielectric structure in the semiconductor substrate between the first source/drain and the second source/drain;
    a dielectric layer on the upper substrate surface between the first source/drain and the second source/drain; and
    an electrode structure comprising an electrode truck portion and at least two electrode branch portions, wherein the electrode truck portion is on the dielectric structure and the dielectric layer, the at least two electrode branch portions are extended from the same electrode truck portion down into the dielectric structure, and arranged along a direction from the first source/drain to the second source/drain, and separated from each other by the dielectric structure.

2. The semiconductor structure according to claim 1, wherein the dielectric structure and the semiconductor substrate have opposing first and second interfaces, the first interface is more adjacent to dielectric layer than the second interface, the electrode branch portions and the first interface have a gap distance substantially bigger than 300 Å therebetween.

3. The semiconductor structure according to claim 1, wherein the dielectric structure and the semiconductor substrate have opposing first and second interfaces, all of the electrode branch portions are in the dielectric structure between the first interface and the second interface.

4. The semiconductor structure according to claim 1, wherein the semiconductor substrate has a trench below the upper substrate surface, the trench is filled with the dielectric structure.

5. The semiconductor structure according to claim 1, wherein the semiconductor structure is a LDMOS or an EDMOS.

* * * * *

UNITED STATES PATENT AND TRADEMARK OFFICE
CERTIFICATE OF CORRECTION

PATENT NO.       : 8,704,304 B1                                           Page 1 of 1
APPLICATION NO.  : 13/645668
DATED            : April 22, 2014
INVENTOR(S)      : Kun-Huang Yu It is certified that error appears in the above-identified patent and that said Letters Patent is hereby corrected as shown below:

On the title page, item [71] Applicant: should read as follows,

UNITED MICROELECTRONICS CORP., Hsinchu, Taiwan

Signed and Sealed this
Nineteenth Day of August, 2014

Michelle K. Lee
*Deputy Director of the United States Patent and Trademark Office*